US012647134B2

(12) United States Patent
Burich et al.

(10) Patent No.: US 12,647,134 B2
(45) Date of Patent: Jun. 2, 2026

(54) SHAPED PARITY BIT RECOVERY VIA BIT-FLIPPING

(71) Applicant: MICRON TECHNOLOGY, INC., Boise, ID (US)

(72) Inventors: Mariano Burich, San Diego, CA (US); Eyal En Gad, Fremont, CA (US); Sivagnanam Parthasarathy, Carlsbad, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 42 days.

(21) Appl. No.: 18/932,318

(22) Filed: Oct. 30, 2024

(65) Prior Publication Data

US 2026/0121662 A1    Apr. 30, 2026

(51) Int. Cl.
*H03M 13/11*        (2006.01)
*G06F 11/10*        (2006.01)
(52) U.S. Cl.
CPC ......... *H03M 13/1108* (2013.01); *G06F 11/10* (2013.01)
(58) Field of Classification Search
None
See application file for complete search history.

(56) References Cited

U.S. PATENT DOCUMENTS

| | | | |
|---|---|---|---|
| 8,954,825 B2 | 2/2015 | Radke | |
| 9,584,158 B2 | 2/2017 | Wu | |
| 10,193,577 B2 | 1/2019 | Kaynak et al. | |
| 2014/0157086 A1* | 6/2014 | Sharon | G06F 11/1012 |
| | | | 711/163 |
| 2016/0142074 A1* | 5/2016 | Sham | H03M 13/116 |
| | | | 714/776 |
| 2017/0269839 A1* | 9/2017 | Alrod | G06F 3/0679 |
| 2020/0382139 A1* | 12/2020 | Yoffe | H04L 27/3405 |
| 2021/0211229 A1* | 7/2021 | Doan | H04L 27/3405 |
| 2021/0373993 A1* | 12/2021 | Sharon | G11C 16/0483 |

(Continued)

OTHER PUBLICATIONS

Bocherer et al., "Probabilistic Parity Shaping for Linear Codes", Feb. 2019, https://doi.org/10.48550/arXiv.1902.10648 (Year: 2019).*

(Continued)

*Primary Examiner* — Daniel F. McMahon
(74) *Attorney, Agent, or Firm* — Tarolli, Sundheim, Covell & Tummino LLP

(57) ABSTRACT

An example includes a method for decoding a shaped codeword that includes shaped data and the shaped parity bits. The shaped codeword has been encoded via an identity matrix comprising an array of layers and block columns of parity data. The method also includes recovering parity data from the shaped parity data of the shaped codeword via the controller. Recovering the parity data includes comparing a syndrome weight of each of a plurality of block columns of the shaped parity data with a threshold and flipping bits of each of the block columns of the shaped parity data in response to the syndrome weight of the respective one of the block columns being greater than the threshold to recover parity data from the shaped parity data of the shaped codeword. The method further includes decoding the shaped data based on the recovered parity data via the controller.

20 Claims, 8 Drawing Sheets

100

(56) References Cited

U.S. PATENT DOCUMENTS

| | | | |
|---|---|---|---|
| 2021/0406118 A1* | 12/2021 | Ismail | G06F 11/1068 |
| 2022/0006532 A1* | 1/2022 | Elzanaty | H04B 10/503 |
| 2022/0263694 A1* | 8/2022 | Iscan | H04L 25/03929 |
| 2023/0033774 A1* | 2/2023 | Koike-Akino | H04L 1/0065 |

OTHER PUBLICATIONS

N. Bonello, S. Chen and L. Hanzo, "Low-Density Parity-Check Codes and Their Rateless Relatives," in IEEE Communications Surveys & Tutorials, vol. 13, No. 1, pp. 3-26, First Quarter 2011, (Year: 2011).*

* cited by examiner

300

400

500 —

600 —

700

INITIATE PARITY DATA RECOVERY OPERATION

705

NEXT ITERATION

710

SET i = 0

715

720

IS $S_{Wi} > S_{TH}$?

730

FLIP ALL BITS OF BLOCK COLUMN i

YES

NO

725 i = LAST INDEX

NO

735 i = i + 1

YES

740

ANY BLOCK COLUMNS FLIP?

YES

NO

750

MAX ITERATIONS?

NO

YES

745

DECODE SHAPED USER DATA

755

END

760

DATA UNRECOVERABLE

SHAPED PARITY BIT RECOVERY VIA BIT-FLIPPING

TECHNICAL FIELD

This disclosure relates to memory devices, and particularly to shaped parity bit recovery via bit-flipping.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, the electronic device may write to, or program, a set of memory cells. To access the stored information, the electronic device may read, or sense, the stored state from the set of memory cells. However, for certain types of memory cells (e.g., in a flash memory), the longer the duration of time that memory cells store data, the more the memory cells experience charge loss that can affect the read characteristics of the memory cell.

DETAILED DESCRIPTION

Figure 1A:
FIG. 1A illustrates a system for encoding/decoding data from a memory sub-system.
Figure 1A:
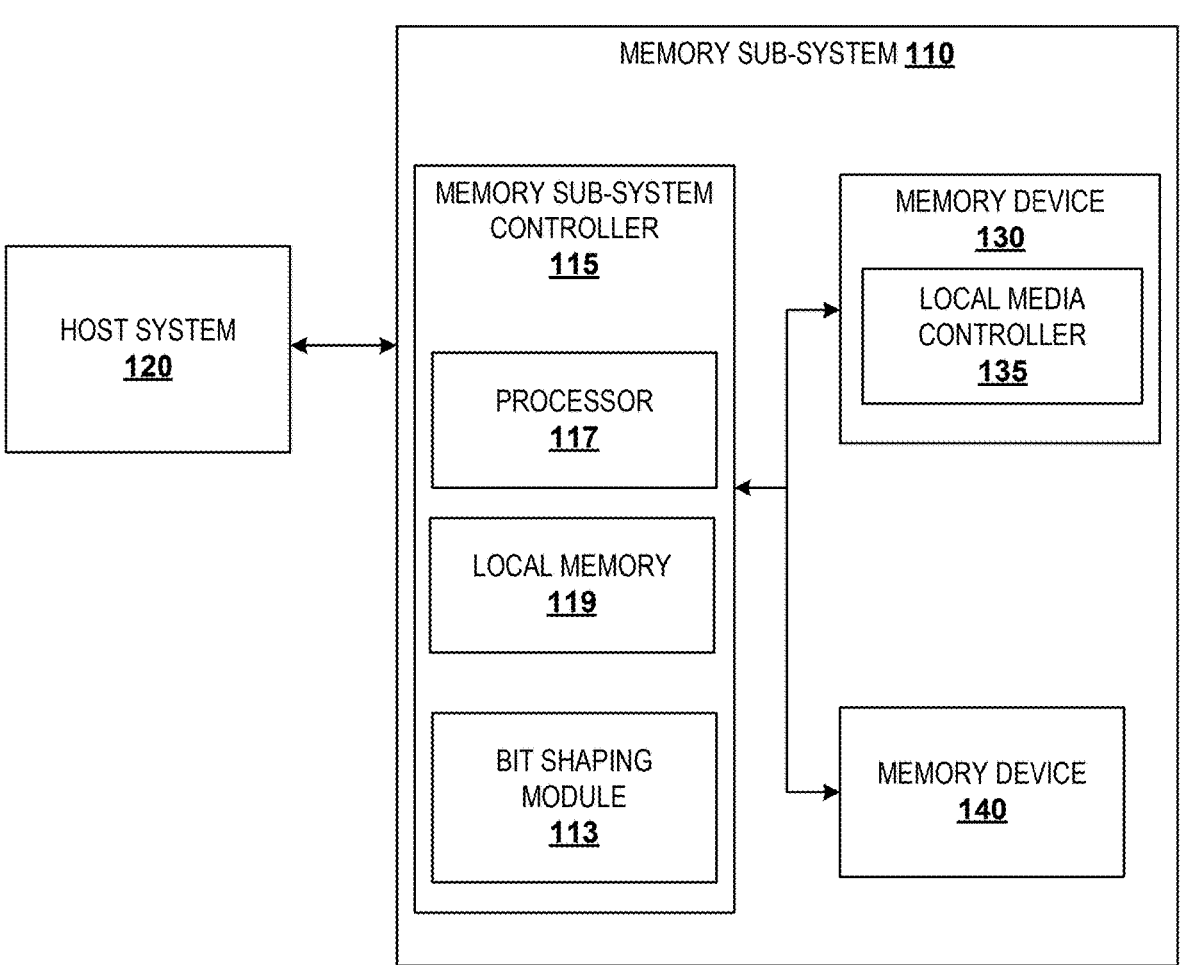

This disclosure relates to memory devices, and particularly to shaped parity bit recovery via bit-flipping. A manner for shaping bits of a codeword is described herein, particularly for shaping parity bits after encoding a codeword. As described herein, to shape a codeword, data (e.g., user data) can be shaped by implementing a bit-shaping algorithm that can flip bits based on one or more bit-shaping criteria. As described herein, the term "bit-flipping" or "flip" with respect to bits describes inverting the logic values of the bits.

The shaped data can be encoded in any of a variety of ways to generate a shaped codeword. During the encoding process, parity data is generated for and appended to the codeword to facilitate decoding of the codeword using any of a variety of decoding processes (e.g., low density parity check (LDPC) decoding). However, since parity bits are generated subsequent to user data shaping and encoding processes, parity data is not shaped in the same manner as the user data.

For example, every time a physical block of memory is read, a high amplitude read voltage pulse is applied to the physical block. Over a large quantity of read operations, the high amplitude read pulses can result in read disturb (RD) stress and read disturb charge loss (RDCL), each of which can deleteriously affect read performances of the memory cells. For example, RD stress can alter the voltage thresholds of a memory cells (e.g., particularly at level zero), thereby resulting in a greater error rate in the data that is read from the memory cells. As another example, RDCL can result in distortion and decrease of charge distributions of voltage thresholds at higher voltage levels (e.g., level fifteen of a sixteen level codeword).

One manner of mitigating the deleterious effects of RD stress and/or RDCL is to provide bit-shaping of codewords. As described herein, the term "bit-shaping" refers to a change in the quantity of memory cells in different voltage levels of a given codeword. For example, by decreasing the quantity of memory cells in the lowest one or more voltage levels and the highest one or more voltage levels, and by correspondingly increasing the quantity of the memory cells in the remaining voltage levels, the codeword can be shaped to provide resilience to the effects of RD stress and/or RDCL. The data of a codeword can be shaped based on implementing a variety of bit-shaping criteria before encoding the data. However, because parity data is generated in response to a data encoding process, the parity data is not also subject to the bit-shaping criteria, and is thus not shaped in the same manner as the data encoded therein.

To generate a shaped codeword in which the parity data is likewise shaped, the bit-shaping algorithm described herein facilitates a parity-shaping algorithm on the parity data to flip bits of block columns of an identity matrix of the parity data based on a parity-shaping criterion. Thus, the shaped codeword can include shaped user data and shaped parity data. The shaped codeword can thus be stored in a memory device (e.g., a NAND device). After the shaped codeword is read from the memory device, the shaped codeword can be decoded. However, to decode the shaped codeword, as described herein, the parity data is recovered from the shaped parity data, such that the shaped user data can be decoded via a decoding operation based on the recovered parity data.

For example, the parity recovery operation can include an iterative parity data recovery process in which a syndrome weight associated to a first layer of a syndrome vector corresponding to each of the block columns of the shaped parity data is compared with a threshold. If the syndrome weight is greater than the threshold, then the bits of the respective block column are flipped. The iterative parity data recovery process steps through each of the block columns iteratively until there are no further bits flipped in any of the block columns in a given iteration of the iterative parity data recovery process. Thus, the iterative parity data recovery process concludes to provide the recovered parity data. As a result, the memory controller can decode the shaped user data of the shaped codeword using the recovered parity data.

A memory sub-system refers to a storage device, a memory module or some combination thereof. The memory sub-system includes a memory device or multiple memory devices that store data. The memory devices could be volatile or non-volatile memory devices. Some examples of a memory sub-system include high density non-volatile memory devices where retention of data is desired during intervals of time where no power is supplied to the memory device. One example of a non-volatile memory device is a not-AND (NAND) memory device. A non-volatile memory device is a package that includes a die(s). Each such die can include a plane(s). For some types of non-volatile memory devices (e.g., NAND memory devices), each plane includes a set of physical blocks, and each physical block includes a set of pages. Each page includes a set of memory cells, which are commonly referred to as cells. A cell is an electronic circuit that stores information. A cell stores one or more bits of binary information and has various logic states that correlate to the number of bits being stored. The logic states are be represented by binary values, such as '0' and '1', or as combinations of such values, such as '00', '01', '10' and '11'.

A memory device includes multiple cells arranged in a two-dimensional or a three-dimensional array. In some examples, memory cells are formed on a silicon wafer in an array of columns connected by conductive lines (also referred to as bitlines, or BLs) and rows connected by conductive lines (also referred to as wordlines or WLs). A wordline is a row of associated memory cells in a memory device that are used with a bitline or multiple bitlines to generate the address of each of the memory cells. The intersection of a bitline and a wordline defines an address of a given memory cell.

A block refers to a unit of the memory device used to store data. In various examples, the unit could be implemented as a group of memory cells, a wordline group, a wordline or as individual memory cells. Multiple blocks are grouped together to form separate partitions (e.g., planes) of the memory device to enable concurrent operations to take place on each plane. A solid-state drive (SSD) is an example of a memory sub-system that includes a non-volatile memory device(s) and a memory sub-system controller to manage the non-volatile memory devices.

The memory sub-system controller is configured/programmed to encode the host and other data, as part of a write operation, into a format for storage at the memory device(s). Encoding refers to a process of generating parity bits from embedded data (e.g., a sequence of binary bits) using an ECC and combining the parity bits to the embedded data to generate a codeword that is written to a memory device in a data write operation. Additionally, the memory sub-system controller can decode codewords, as part of a read operation, stored at the memory device(s) of the memory sub-system. Decoding refers to a process of reconstructing the original embedded data (e.g., sequence of binary bits) from the codeword (e.g., the encoded original embedded data) received from storage at the memory device(s). As an example, the decoding process can include an error correction code (ECC) to identify and correct errors in the data when the data is decoded.

For example, data strings can be encoded by an ECC encoder by adding a number of redundant and/or parity bits to create corresponding codewords. When an original data string is to be retrieved from the memory, an ECC decoder can use the corresponding codewords to identify bit errors in the encoded data string. If bit errors are present, one or more ECC operations can be employed to correct the bit errors and to recover the original data string. In addition to outputting error-checked and/or error-corrected data, some implementations of the ECC can also generate metadata regarding an ECC decode operation.

One example of decoding utilizes a low density parity check (LDPC) decoding process. LDPC decoding refers to a decoding method that utilizes the LDPC code to reconstruct the original embedded data. As example, an LDPC code is defined by, among other things, a sparse parity-check matrix, alternatively referred to as an H matrix, denoted as $\bar{H}$. Each row of the H matrix embodies a linear constraint imposed on a designated subset of data bits. Entries within the H matrix, either '0' or '1', signify the participation of individual data bits in each constraint. Stated differently, each row of the H matrix represents a parity-check equation, and each column corresponds to a bit in the codeword. During encoding, the embedded data is multiplied by the generator matrix, which is the inverse of the H matrix associated with a chosen LDPC code, to generate parity bits. The generated parity bits are appended to the embedded data to generate an LDPC codeword. The LDPC codeword includes the embedded data and the parity bits, allowing for identification and rectification of errors. The LDPC codeword is storable at the memory device(s) of the memory sub-system.

Initially, during LDPC decoding, the LDPC codeword is compared with the expected relationships encoded in the H matrix. In particular, the LDPC codeword is multiplied by a transpose of the H matrix associated with the LDPC code used to encode the LDPC codeword. This operation can also be performed without making a matrix multiplication by sequentially checking each parity using XOR operations. The result of the multiplication produces a vector (e.g., a syndrome vector), in which each element corresponds to a specific parity-check equation in the sparse parity-check matrix. The number of non-zero entries in the syndrome vector corresponds to the non-satisfied (e.g., failed) parity checks, and the number of non-satisfied parity checks is the syndrome weight. A syndrome vector with zero values signifies that the corresponding parity-check equation is satisfied (e.g., no errors or having even number of bit errors in the parity check equation), and a syndrome vector with non-zero values indicates potential errors impacting the bits involved in the corresponding parity-check equation. Potential errors, for example, may be due to the bits involved in the corresponding parity-check equation being flipped due to noise, interference, distortion, bit synchronization errors or errors from the media itself (both intrinsic and extrinsic). For example, a bit that may have originally been stored as a '0' may be flipped to a '1' or vice versa.

One type of the iterative error correction is a quasi-cyclic (QC)-LDPC code circuit that reduces computing and memory cost of an LDPC solution. QC-LDPC codes are a special class of the LDPC codes with structured H matrix which can be generated by the expansion of a $m_b \times n_b$ base matrix. Each U's element in the base matrix can be expanded by a circularly right-shifted b×b identity submatrix. QC-LDPC codes have advantages over other types of LDPC codes in hardware implementations of both encoding and decoding. For example, encoding of a QC-LDPC code can be efficiently implemented using simple shift registers. In hardware implementation of a QC-LDPC decoder, the QC structure of the code simplifies the wire routing for message passing.

Examples of a QC-LDPC decoding process can provide for an identity sub-matrix $H_P$ in sparse matrix $H=[H_1, H_P]$. An efficient encoding algorithm was derived exploiting the sparseness of $H_P$ and back-substitution over the identity matrix T. A special class of QC-LDPC codes which exhibit special identity QC H sub-matrix (i.e., H contains an identity QC sub-matrix T whose dimension is near to m) provides for an efficient encoding algorithm which further incorporates the QC property into the back-substitution approach. As an example, QC encoding processes can implement an identity matrix for the parity data of a codeword. The identity matrix can be composed of an array of layers corresponding to groups of check nodes and block columns corresponding to groups of parity bits. The grouping of the check nodes and parity bits can be based on a circulant size of the identity matrix. The circulant size can thus form groupings for syndrome weights of corresponding syndrome vectors that are implemented during the decoding process (e.g., QC-LDPC decoding).

As described above, bit-shaping of codewords can mitigate the deleterious effects of RD stress and/or RDCL. One manner of providing bit-shaping is to flip groups of bits of the data (e.g., with such groups described as "windows") that satisfy a bit-shaping criterion. For example, a given codeword can be shaped by encoding the codeword to have fewer logic-1 values than logic-0 values. A bit-shaping algorithm can thus be implemented to evaluate each of the windows of the data and to flip the bits of the window if the window satisfies a bit-shaping criterion of having more logic-1 values than logic-0 values. The flipping of the windows can be identified by flip indicator data that can provide information as to which of the windows have been flipped prior to the encoding process for shaping the codeword. The flip indicator data can likewise be encoded as part of the shaped codeword. But because parity data is generated by the encoding process subsequent to the bit-shaping algorithm, parity data is not shaped after the shaped data is encoded.

As described herein, the parity data that is generated for shaped encoded data can also be shaped to provide for a shaped codeword that can be more resilient to the effects of RD stress and/or RDCL. After the shaped data is encoded, the parity data can be shaped by a modified operation of the bit-shaping algorithm. The bit-shaping algorithm can evaluate the parity bits of each of the block columns of the associated identity matrix of the parity data to determine if the parity bits satisfy a bit-flipping criterion. For example, the bit-flipping criterion can be the same as or similar to the bit-shaping criterion that was implemented to shape the data of the codeword. Thus, in response to determining if layers of the parity bits of the block columns satisfy the bit-flipping criterion, the parity-shaping algorithm can flip the parity bits of the block column. In response to flipping all of the block columns that satisfy the bit-flipping criterion, the parity data can likewise be shaped and appended to the shaped data to provide a shaped codeword. The shaped codeword can thus be saved to the memory device, and can be more resilient to the effects of RD stress and/or RDCL relative to unshaped codewords (e.g., having uniform voltage levels).

After the shaped codeword is read from the memory device, the shaped codeword can be decoded via a decoding algorithm (e.g., QC-LDPC decoding). To decode the shaped codeword, the decoding module can recover the parity data from the shaped parity data first, and can then decode the shaped data using the recovered parity data. To recover the parity data, the associated controller can implement an iterative parity data recovery process. The iterative parity data recovery process can include iteratively comparing a syndrome weight of a syndrome vector corresponding to each of the block columns of the identity matrix of the shaped parity data with a threshold. As one example, the threshold can be static through the entire iterative parity data recovery process. As another example, the threshold can be variable based on a variety of factors, as described in greater detail herein. The iterative parity data recovery process can thus step through each of the block columns and flip the bits of the respective block columns based on the comparison until there are no further bits flipped in any of the block columns in a given iteration of the iterative parity data recovery process. Thus, the iterative parity data recovery process concludes to provide the recovered parity data that can be implemented to decode the shaped user data of the shaped codeword.

FIG. 1A illustrates a system 100 that includes a memory sub-system 110 that can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card and a hard disk drive (HDD). Examples of memory modules include a dual in-line memory module (DIMM), a small outline DIMM (SO-DIMM) and various types of non-volatile dual in-line memory modules (NVDIMMs).

The system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment or a networked commercial device) or such computing device that includes memory and a processing device. The system 100 can include a host system 120 that is coupled to one or more memory sub-systems 110. In some examples, the host system 120 is coupled to different types of the memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory device(s) 130) when the memory sub-system 110 is coupled with the host system 120 by the physical host interface (e.g., PCIe or CXL bus). The physical host interface can provide an interface for passing control, address, data and other signals between the memory sub-system 110 and the host system 120. FIG. 1A illustrates a memory sub-system 110 as an example. In general, the host system 120 can access multiple memory sub-systems via a same communication connection, multiple separate communication connections and/or a combination of communication connections.

The memory device 130 and the memory device 140 are implemented as non-transitory computer readable media. The memory device 130 and the memory device 140 can include any combination of the different types of non-volatile memory devices and/or volatile memory devices. The volatile memory devices (e.g., the memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) or higher, can store multiple bits per cell. In some examples, each of the memory device(s) 130 can include one or more arrays of memory cells such as SLCs, MLCs, TLCs, QLCs, PLCs or some combination thereof. In some examples, a particular memory device can include an SLC portion, an MLC portion, a TLC portion, a QLC portion and/or a PLC portion of memory cells. The memory cells of the memory device(s) 130 can be grouped as pages that can refer to a logical unit of the memory device used to store data. In some types of memory (e.g., NAND), pages can be grouped to form blocks 106. The blocks 106 can include sub-blocks, and can be organized across a set of planes of the memory device 130.

As an example, a block (sometime referred to herein as "physical block") 106 of the memory device 130 according to the present disclosure has at least two decks. A functional deck refers to a deck that satisfies criteria pertaining to a functionality of the deck. For example, the criteria can include that a metric of the deck (e.g., an average RBER) does not exceed a threshold value that is considered as an indication of a normal function of the deck. A defective deck refers to a deck that does not satisfy the criteria pertaining to the functionality of the deck. For example, the metric of the deck (e.g., an average RBER) does not exceed a threshold value that is considered as an indication of a normal function of the deck. The criteria used for the functional deck and the defective deck can be the same or different. In some implementations, a defective deck may be identified by program status failure.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM), etc.

A memory sub-system controller 115 (or controller 115 for simplicity) communicates with the memory device(s) 130 to perform operations such as reading data, writing data or erasing data at the memory device(s) 130 and other such operations. The memory sub-system controller 115 can include hardware such as one or more integrated circuits and/or discrete components, a buffer memory or some combination thereof. The hardware can include a digital circuitry with dedicated (e.g., hard-coded) logic to perform the operations described herein. The memory sub-system controller 115 can be a microcontroller, special purpose logic circuitry (e.g., a field programmable gate array (FPGA), an application specific integrated circuit (ASIC), etc.) or another suitable processor.

The memory sub-system controller 115 can include a processing device, which includes one or more processors (e.g., the processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. The local memory 119 is a non-transitory computer-readable medium.

In some examples, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another example, a memory sub-system 110 does not include a memory sub-system controller 115 and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations and address translations between a logical address (e.g., a logical block address (LBA), namespace) and a physical address (e.g., physical block address) that are associated with the memory device(s) 130. The memory sub-system controller 115, for example, may employ a Flash Translation Layer (FTL) to translate logical addresses to corresponding physical memory addresses, which can be stored in one or more FTL mapping tables. In some instances, the FTL mapping table can be referred to as a logical-to-physical (L2P) mapping table storing L2P mapping information. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. For example, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some examples, the memory device(s) 130 include local media controllers 135 that operate in concert with the memory sub-system controller 115 to execute operations on one or more memory cells of the memory device(s) 130. An external controller (e.g., the memory sub-system controller 115) can externally manage the memory device 130 (e.g., perform media management operations on the memory device 130). In some examples, the memory sub-system 110 is a managed memory device, which is a raw memory device 130 having control logic (e.g., local media controller 135) on the die and a controller (e.g., the memory sub-system controller 115) for media management within the same memory device package. An example of a managed memory device is a managed NAND (MNAND) device.

In operation, the host system 120 manages and controls the flow of data between itself and the memory sub-system 110, ensuring efficient data storage and retrieval operations. More generally, the host system 120 employs the memory sub-system 110 to write data to and read data from the memory sub-system 110. For instance, the host system 120 processes these request for reading and/or write data by interacting with the memory sub-system 110, managing the flow of data to and from the memory device 130 and/or the memory device 140 within the memory sub-system 110. This reading and writing of data enables operation of computing systems where data access and management is needed.

In various examples, the memory sub-system 110 includes a bit-shaping module 113 that can be configured to implement a data shaping algorithm. As an example, data shaping algorithm can include a parity-shaping algorithm and an iterative parity data recovery process. In some examples, the memory sub-system controller 115 includes at least a portion of the bit-shaping module 113. In some examples, the bit-shaping module 113 is part of the host system 120, an application or an operating system. In other examples, local media controller 135 includes a portion of the bit-shaping module 113 and is configured to perform the functionality described herein.

As described herein, the bit-shaping module 113 can provide data shaping of the codeword to generate a shaped codeword that can be more resilient to the effects of RD stress and/or RDCL. As an example, the bit-shaping module 113 can implement a bit-shaping algorithm on the user data that is to be encoded to shape the user data. The shaped user data can then be encoded to generate parity bits. The bit-shaping module 113 can then shape the parity data, such that the shaped parity data can be added or appended to the shaped user data to provide a shaped codeword that can be stored in the memory device 130.

The bit-shaping module 113 can also be configured to recover the parity data from the shaped parity data to facilitate decoding of the shaped codeword. To recover the parity data, the bit-shaping module 113 can implement an iterative parity data recovery process, in which a syndrome weight associated to a first layer of a syndrome vector corresponding to each of the block columns of an identity matrix of the shaped parity data with a threshold in an iterative manner. As one example, the threshold can be static through the entire iterative parity data recovery process. As another example, the threshold can be variable based on a variety of factors, as described in greater detail herein. The iterative parity data recovery process can thus step through each of the block columns and flip the bits of the respective block columns based on the comparison until there are no further bits flipped in any of the block columns in a given iteration of the iterative parity data recovery process. Thus, the iterative parity data recovery process concludes to provide the recovered parity data that can be implemented to decode the shaped user data of the shaped codeword.

Figure 1B:
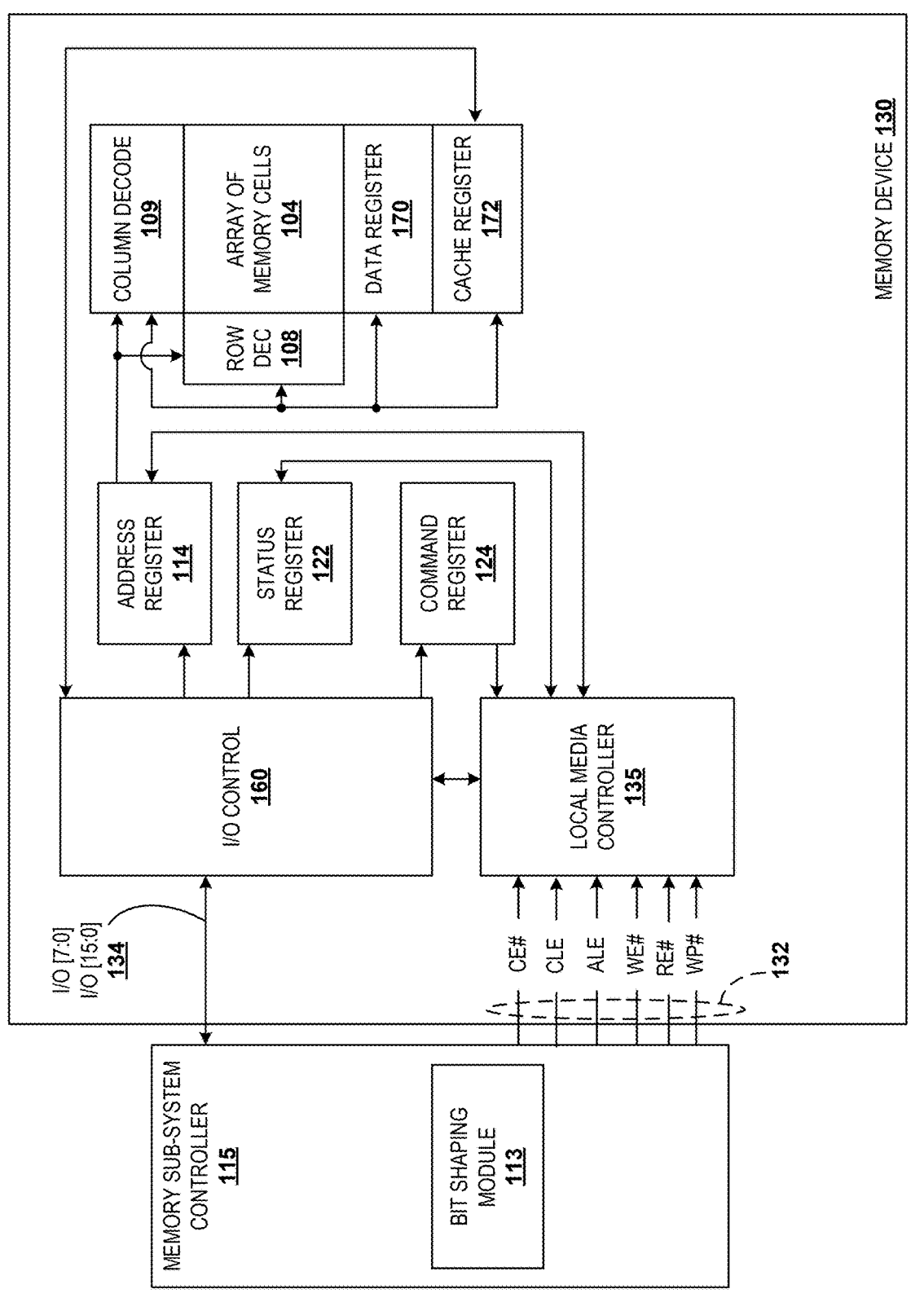
FIG. 1B illustrates a simplified block diagram of an example memory device in communication with a memory sub-system controller.

FIG. 1B illustrates a simplified block diagram of an example of a first apparatus, in the form of a memory device 130, in communication with an example of a second apparatus, in the form of a memory sub-system controller 115 of a memory sub-system (e.g., the memory sub-system 110 of FIG. 1A). Some examples of electronic systems include personal computers, personal digital assistants (PDAs), digital cameras, digital media players, digital recorders, games, appliances, vehicles, wireless devices, mobile telephones, etc. The memory sub-system controller 115 (e.g., a controller external to the memory device 130), can be a memory controller or other external host device.

The memory device 130 includes an array of memory cells 104 logically arranged in rows and columns. As an example, the memory cells 104 can be arranged in an assortment of multiple blocks, with each block including a set of sub-blocks. The blocks/sub-blocks are grouped together to form the planes of the memory device 130. The memory cells 104 form a non-transitory computer-readable medium. Memory cells of a logical row are connected to the same access line (e.g., a wordline) while memory cells of a logical column are selectively connected to the same data line (e.g., a bit line) in some examples. In some examples, a single access line is associated with more than one logical row of memory cells and a single data line may be associated with more than one logical column. Memory cells of at least a portion of the array of memory cells 104 are capable of being programmed to one of at least two target data states.

The memory device 130 includes row decode circuitry 108 and column decode circuitry 109 for decoding address signals. Address signals are received and decoded to access an array of memory cells 104 of the memory device 130. The memory device 130 also includes input/output (I/O) control circuitry 160 to manage input of commands, addresses and data to the memory device 130 as well as output of data and status information from the memory device 130. The memory device 130 has an address register 114 and is in communication with the I/O control circuitry 160, the row decode circuitry 108 and the column decode circuitry 109 to latch the address signals prior to decoding. The memory device 130 also includes a command register 124 in communication with the I/O control circuitry 160 and a local media controller 135 to latch incoming commands.

A controller (e.g., the local media controller 135 internal to the memory device 130) controls access to the array of memory cells 104 in response to the commands and generates status information for the external memory sub-system controller 115. For example, the local media controller 135 is configured to perform access operations (e.g., read operations, programming operations and/or erase operations) on the array of memory cells 104. The local media controller 135 is in communication with the row decode circuitry 108 and the column decode circuitry 109 to control the row decode circuitry 108 and the column decode circuitry 109 in response to the addresses.

As described above in the example of FIG. 1A, the bit-shaping module 113 can be configured to shape a codeword to provide resiliency against the effects of RD stress and RDCL. The bit-shaping module 113 can implement a bit-shaping algorithm on the user data by flipping windows of bits that satisfy one or more bit-shaping criteria prior to encoding the data. The encoded shaped data can thus include parity bits which can be shaped by the bit-shaping module 113 subsequent to encoding to provide a shaped codeword that includes the shaped data and the shaped parity data. The bit-shaping module 113 can also recover the parity data from the shaped parity data to facilitate decoding of the shaped data.

The local media controller 135 is also in communication with a cache register 172. The cache register 172 latches data, either incoming or outgoing, as directed by the local media controller 135 to temporarily store data while the array of memory cells 104 is busy writing or reading, respectively, other data. During a programming operation (e.g., write operation), data is passable from the cache register 172 to the data register 170 for transfer to the array of memory cells 104, and new data can be latched in the cache register 172 from the I/O control circuitry 160. During a read operation, data is passable from the cache register 172 to the I/O control circuitry 160 for output to the memory sub-system controller 115. New data is passable from the data register 170 to the cache register 172. The cache register 172 and/or the data register 170 form (e.g., or form a portion of) a page buffer of the memory device 130. The page buffer includes sensing devices (not shown in FIG. 1B) to sense a data state of a memory cell of the array of memory cells 104. For example, the sensing devices sense a state of a data line connected to that memory cell. The memory device 130 also includes a status register 122 in communication with the I/O control circuitry 160 and the local media controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE # and/or a write protect signal WP #. Additional or alternative control signals (not shown) can be further received over control link 132 depending upon the nature of the memory device 130. In some examples, the memory device 130 receives command signals (which represent commands), address signals (which represent addresses) and data signals (which represent data) from the memory sub-system controller 115 over a multiplexed input/output (I/O) bus 134 and outputs data to the memory sub-system controller 115 over the I/O bus 134.

In some examples, the commands are received over input/output (I/O) pins [7:0] of the I/O bus 134 at I/O control circuitry 160 and may then be written into the command register 124. The addresses are received over input/output (I/O) pins [7:0] of the I/O bus 134 at I/O control circuitry 160 and written into the address register 114. The data is receivable over input/output (I/O) pins [7:0] for an 8-bit device or input/output (I/O) pins [15:0] for a 16-bit device at I/O control circuitry 160 and is writable into the cache register 172. The data is subsequently written into the data register 170 for programming the array of memory cells 104 in some examples.

In some examples, the cache register 172 is omitted, and in such examples, the data is written directly into the data register 170. Additionally or alternatively, data is output over input/output (I/O) pins [7:0] for an 8-bit device or input/output (I/O) pins [15:0] for a 16-bit device. Moreover, it is noted that although reference is made to I/O pins, in other examples, a different conductive node providing for electrical connection to the memory device 130 by an external device (e.g., the memory sub-system controller 115), such as conductive pads or conductive bumps could be used in addition to or as a replacement for the I/O pins.

The example memory device 130 of FIG. 1B has been simplified. Moreover, in other examples, the functionality of the various block components described with reference to FIG. 1B are not segregated to distinct components or component portions of an integrated circuit device. For example, a single component or component portion of an integrated circuit device could be adapted to perform the functionality of more than one block component of FIG. 1B. Alternatively, components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) are useable in various examples.

Figures 2A, 2B:
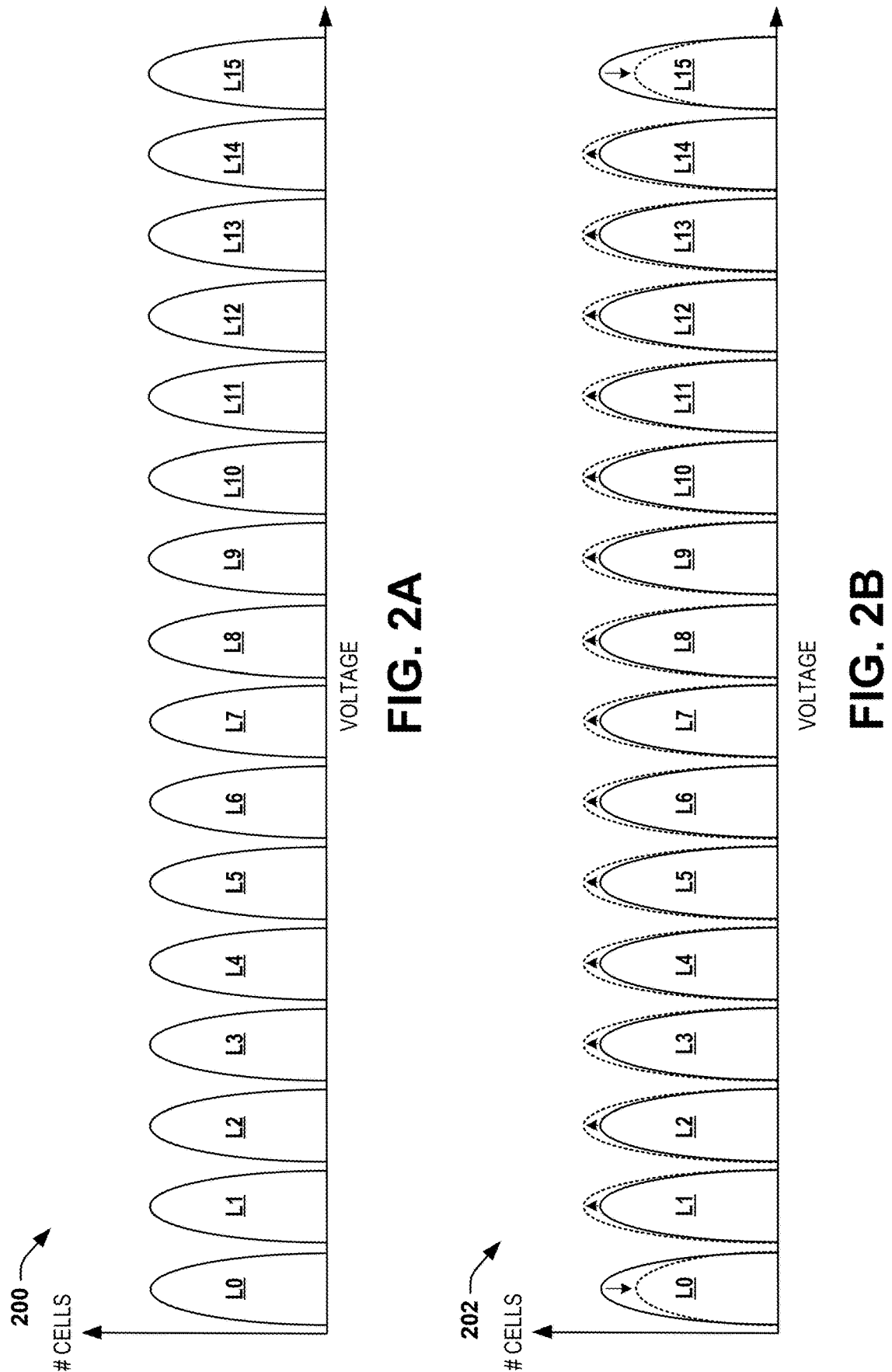
FIG. 2A illustrates an example diagram of voltage graphs for reading data.
FIG. 2B illustrates another example diagram of voltage graphs for reading data.

FIG. 2A illustrates an example diagram of a voltage graph 200 for reading data. As an example, the voltage graph 200 can correspond to read voltage levels (e.g., threshold voltages) for reading encoded data (codewords) from memory cells of the memory device 130 over a quantity of memory cells to be read. The read voltage levels can correspond to programmed states of the array of memory cells 104 of the memory device 130. The example shown in FIG. 2A represents four-bit, e.g., sixteen-state, memory cells. Therefore, the voltage levels represent sixteen target states to which the memory cells can be programmed. In the example of FIG. 2A, the sixteen target states are labeled zero through fifteen (L0-L15). Each of the voltage levels includes a four-bit binary code corresponding to the respective voltage level. The example of FIG. 2A is not limited to the non-consecutive four-bit binary codes demonstrated, but could instead each be any of a variety of different binary values. In the example of FIG. 2A, the voltage levels are demonstrated as approximately uniform with respect to the quantity of memory cells.

As described above, every time a block 106 of the memory device 130 is read, a high amplitude read voltage pulse is applied to the block 106. Over a large quantity of read operations, the high amplitude read pulses can result in RD stress and RDCL, each of which can deleteriously affect read performances of the memory cells 104. For example, RD stress can alter the voltage thresholds of the memory cells, thereby resulting in a greater error rate in the data that is read from the memory cells. RD stress can be exhibited based on the voltages of lower voltage levels (e.g., voltage levels 0 and/or 1) shifting to a higher amplitude. As another example, RDCL can result in distortion and decrease of charge distributions of voltage thresholds at higher voltage levels (e.g., voltage levels 14 and/or 15) shifting to a lower amplitude resulting from charge loss. Such shifts in voltage threshold amplitudes can cause bit errors during a read operation of the respective memory cell 104.

FIG. 2B illustrates another example diagram of a voltage graph 202 for reading data. Similar to as described above for the graph 200, the voltage graph 200 can correspond to read voltage levels (e.g., threshold voltages) for reading encoded data (codewords) from memory cells of the memory device 130 over a quantity of memory cells to be read. The example shown in FIG. 2B represents four-bit, e.g., sixteen-state, memory cells, representing sixteen target states to which the memory cells can be programmed. In the example of FIG. 2B, the sixteen target states are labeled zero through fifteen (L0-L15), with each of the voltage levels including a four-bit binary code corresponding to the respective voltage level. The example of FIG. 2B is not limited to the non-consecutive four-bit binary codes demonstrated, but could instead each be any of a variety of different binary values.

The graph 202 in example of FIG. 2B can correspond to a modified version of the graph 200 as a result of bit-shaping of the associated codeword. The graph 202 demonstrates the levels in a solid line, which is the same as the graph 200 in the example of FIG. 2A, and the levels in a dotted line corresponding to the voltage levels of the bit-shaped codeword of which the graph 202 is representative. Thus, while the voltage graph 200 in the example of FIG. 2A demonstrated uniformity with respect to the quantity of memory cells in each of the voltage levels, the graph 202 is demonstrated as non-uniform. In the example of FIG. 2B, the first voltage level (L0) and the sixteenth voltage level (L15) are demonstrated as reduced regarding the quantity of memory cells relative to the graph 200. Because the quantity of memory cells in the first and sixteenth is reduced, the quantity of memory cells is demonstrated in the example of FIG. 2B as having increased in each of the voltage levels therebetween.

Because RD stress affects the lowest voltage levels of a codeword and RDCL affects the highest voltage levels of a codeword, the shaped codeword represented by the graph 202 can be resistant to the effects of RD stress and RDCL, respectively. Accordingly, bit-shaping can provide for a more robust storage of data in a memory device (e.g., the memory device 130) over time and/or over multiple read/write operations.

As an example, bit-shaping can be implemented by flipping groups of bits of the user data (e.g., with such groups described as "windows") that satisfy a bit-shaping criterion. For example, the windows can have a same size as a circulant size of the QC-LDPC decoding scheme (e.g., the above described variable "b" of the b×b identity sub-matrix). As an example, a given codeword can be shaped by encoding the codeword to have fewer logic-1 values than logic-0 values. However, bit-shaping is not limited to such criterion, and a variety of other bit-shaping criteria can instead be implemented. A bit-shaping algorithm can thus be implemented to evaluate each of the windows of the data and to flip the bits of the window if the window satisfies the criterion. The flipping of the windows can be identified by flip indicator data that can provide information as to which of the windows have been flipped prior to the encoding process for shaping the codeword. The flip indicator data can likewise be encoded as part of the shaped codeword.

However, parity data is generated by the encoding process subsequent to the implementation of the bit-shaping algorithm. Therefore, parity data is generated after the shaped data is encoded, and is thus not shaped by the same bit-shaping algorithm as the user data and flip indicator data.

Because parity data is not shaped, the parity data may not follow the same criteria to provide the bit-shaping as the user data (and flip indicator data), and can thus negatively affect the quantity of memory cells in the voltage levels to counteract the shaping of the user data. As a result, a codeword with unshaped parity data can be more susceptible to RD stress and RDCL.

As described herein, the parity data that is generated for shaped encoded data can also be shaped subsequent to the encoding of the user data to provide for a shaped codeword that can be more resilient to the effects of RD stress and/or RDCL. After the shaped data is encoded, the parity data can be shaped by a modified operation of the bit-shaping algorithm. As an example, the bit-shaping algorithm can evaluate the parity bits of each of the block columns of the associated identity matrix (e.g., of a quasi-cyclic encoding process) of the parity data to determine if the parity bits satisfy a bit-flipping criterion. For example, the bit-flipping criterion can be the same as or similar to the bit-shaping criterion that was implemented to shape the data of the codeword. Thus, in response to determining if layers of the parity bits of the block columns satisfy the bit-flipping criterion, the parity-shaping algorithm can flip the parity bits of the block column. In response to flipping all of the block columns that satisfy the bit-flipping criterion, the parity data can likewise be shaped and appended to the shaped data to provide the resultant shaped codeword. The shaped codeword can thus be saved to the memory device, and can be more resilient to the effects of RD stress and/or RDCL relative to unshaped codewords (e.g., having uniform voltage levels like the codeword represented by the graph 200).

Figure 3:
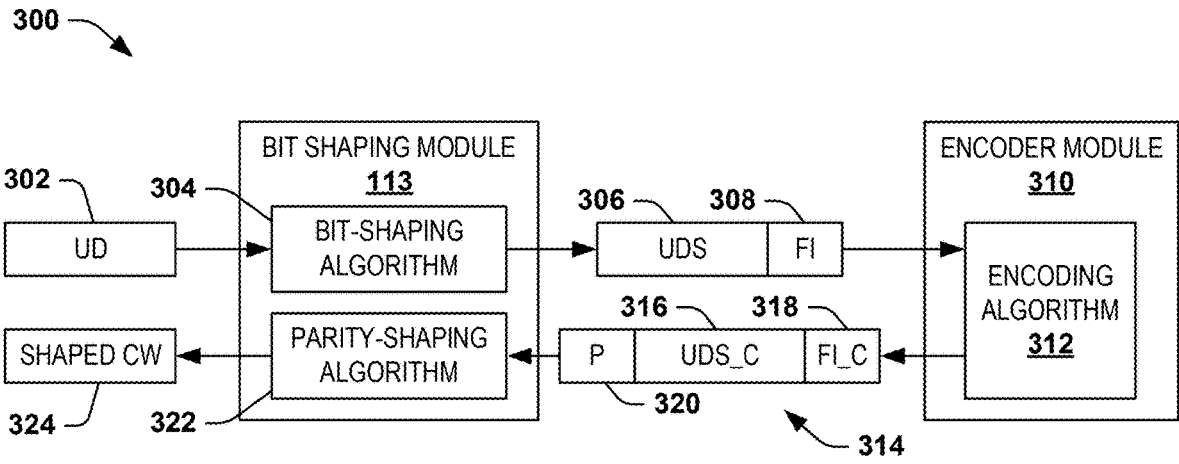
FIG. 3 illustrates an example block diagram of encoding data.

FIG. 3 illustrates an example block diagram 300 of encoding data. The block diagram 300 demonstrates a high-level process of the encoding a codeword of data to provide a shaped codeword. In the diagram 300, user data ("UD") 302 is provided to the bit-shaping module 113 to be shaped by a bit-shaping algorithm 304.

The bit-shaping algorithm 304 can be configured to provide bit-shaping of the user data 302. For example, the bit-shaping algorithm 304 can be configured to evaluate groups (e.g., windows) of bits of the user data 302 to determine whether the groups of bits satisfy a bit-shaping criterion. As an example, the bit-shaping criterion can be to have fewer logic-1 values than logic-0 values. Therefore, if a given group of bits satisfies the bit-shaping criterion, the bit-shaping algorithm 304 flips the bits in the group. The resulting user data can thus be shaped to affect the voltage levels of the resultant codeword. In addition, the bit-shaping algorithm 304 can generate flip indicator data that provides information as to which of the groups of bits have been flipped. In the example of FIG. 3, shaped user data ("UDS") 306 and flip indicator data ("FI") 308 are demonstrated as being output from the bit-shaping algorithm 304 of the bit-shaping module 113.

The shaped user data 306 and the flip indicator data 308 is provided to an encoder module 310 to be encoded by an encoding algorithm 312. The encoding algorithm 312 can be any of a variety of encoding algorithms, such as a QC encoding algorithm. The encoding algorithm 312 generates parity data that can be later implemented for decoding the resultant codeword. In the example of FIG. 3, a codeword 314 is output from the encoder module 310. The codeword 314 includes encoded shaped user data ("UDS_C") 316, encoded flip indicator data ("FI_C") 318, and parity data ("P") 320. While the codeword 314 includes shaped (encoded) user data 316, the parity data 320 is not shaped, and can undesirably affect the voltage levels of the codeword 314 as stored in the memory device 130.

The codeword 314 is thus demonstrated as being provided again to the bit-shaping module 113 to be shaped by a parity-shaping algorithm 322. The parity-shaping algorithm 322 can thus provide bit-shaping of the parity data 320. As an example, the parity data 320 can be represented by an identity matrix that is grouped into layers (multiple check-nodes) and block columns (multiple parity bits). As an example, the parity-shaping algorithm 322 can shape the parity data 320 by evaluating the parity bits of each of the block columns of the identity matrix of the parity data 320 to determine if the parity bits satisfy a bit-flipping criterion (e.g., the same as or similar to the data-shaping criterion). In response to determining if layers of the parity bits of the block columns satisfy the bit-flipping criterion, the parity-shaping algorithm can flip the parity bits of the respective block column.

As a first example of the parity-shaping algorithm 322, the parity-shaping algorithm 322 does not store flip indicators for the flipped block columns of the parity data 320. As a second example of the parity-shaping algorithm 322, the parity-shaping algorithm 322 stores flip indicators for the flipped block columns of the parity data 320. The storage of flip indicators or not for the parity data 320 can be deter-minative of an associated parity recovery algorithm, as described in greater detail herein. In response to flipping all of the block columns that satisfy the bit-flipping criterion, the parity data 320 can likewise be shaped and appended to the shaped encoded user data 316 to provide a shaped codeword 324 that is saved to the memory device 130.

Figure 4:
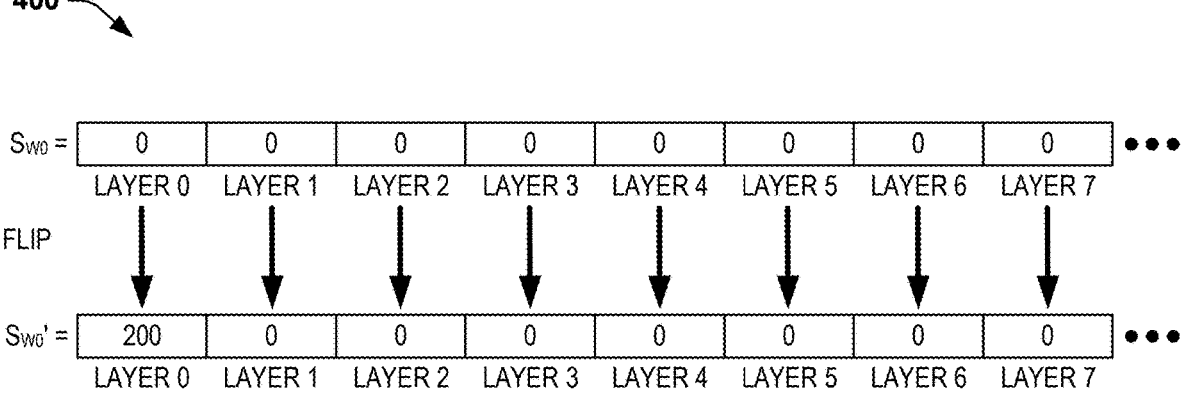
FIG. 4 illustrates an example diagram of flipping a syndrome vector of parity data.

FIG. 4 illustrates an example diagram 400 of flipping a syndrome vector of parity data. The diagram 400 demon-strates the syndrome vector $S_{W0}$ associated with a first block column that includes layers 0-7. In the following example, the syndrome vector $S_{W0}$ has 100 layers ("LAYER 0" through "LAYER 99"), but only layers 0-7 are demonstrated for brevity. As an example, the parity-shaping algorithm 322 can determine that the first block column of the identity matrix satisfies the bit-flipping criterion. Therefore, the parity-shaping algorithm 322 can flip the bits of the first block column. As a result, the syndrome vector $S_{W0}$ becomes a flipped syndrome vector $S_{W0}'$ after the bit flipping of the first block column. The diagram 400 demonstrates the effect of the bit-flipping on the flipped syndrome vector $S_{W0}'$. In the example of FIG. 4, the first layer ("LAYER 0") switches from a syndrome weight of 0 to 200 (e.g., as an arbitrary example).

The parity-shaping algorithm 322 can thus step through each of the block columns of the identity matrix (e.g., $H_P$) in sequence to determine if the respective block column satisfies the bit-flipping criterion, and can flip the bits of the respective block column if the bit-flipping criterion is sat-isfied. Upon stepping through the entirety of the block columns of the identity matrix $H_P$, the parity data 320 can thus be shaped and appended to the encoded shaped user data 316 to form the shaped codeword 324.

Figure 5:
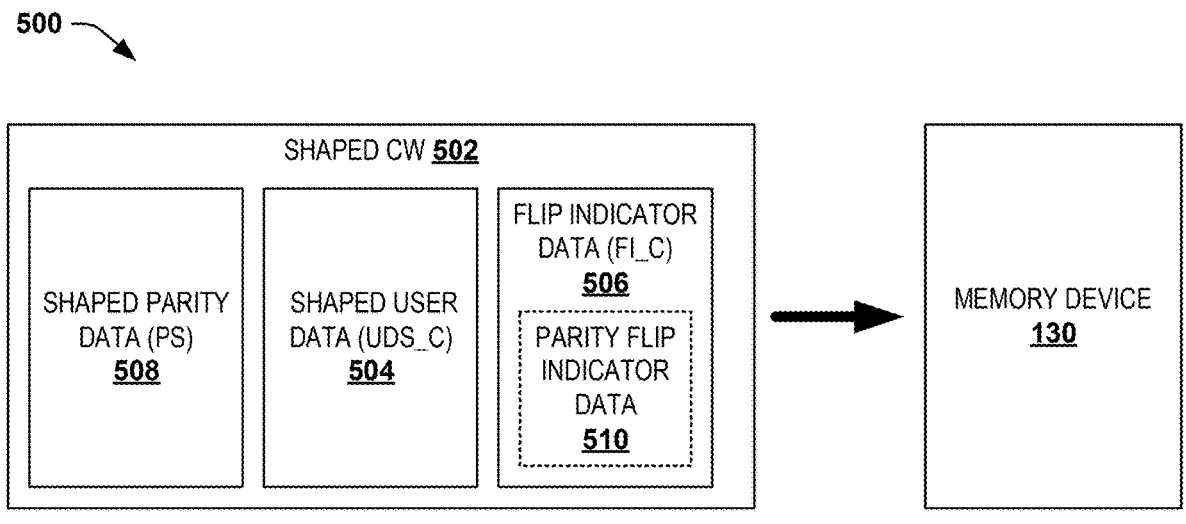
FIG. 5 illustrates an example diagram of a data write operation.

FIG. 5 illustrates an example diagram 500 of a data write operation. The diagram 500 includes a shaped codeword ("SHAPED CW") 502 being provided to the memory device 130. The shaped codeword 502 includes a shaped encoded user data ("UDS_C") 504, an encoded flip indicator data ("FI_C") 506, and a shaped parity data ("PS") 508. As an example, the shaped encoded user data 504 can correspond to the encoded shaped user data 316, the encoded flip indicator data 506 can correspond to the encoded flip indicator data 318, and the shaped parity data 508 can correspond to the output of the parity-shaping algorithm 322, as described above in the examples of FIG. 4. The shaped codeword 502 can thus be stored in the memory device 130 to provide the shaped voltage levels with respect to the quantity of memory cells, such as described above in the example of FIG. 2B, to mitigate the effects of RD stress and/or RDCL.

In the example of FIG. 5, the encoded flip indicator data 506 includes parity flip indicator data 510 (unencoded) in dotted lines. The parity flip indicator data 510 can be generated by the parity-shaping algorithm 322 and appended to the encoded flip indicator data 506 (or another portion of the shaped codeword 502) as one example of the parity-shaping algorithm 322. In such an example, the parity flip indicator data 510 can be implemented in a respective example of a parity recovery process, as described in greater detail herein. Alternatively, as another example, the parity-shaping algorithm 322 may not generate the parity flip indicator data 510, such that another example of a parity recovery process can be implemented agnostic of the indi-cation of bit-flips of the block columns of the identity matrix of the parity data, as also described in greater detail herein.

Figure 6:
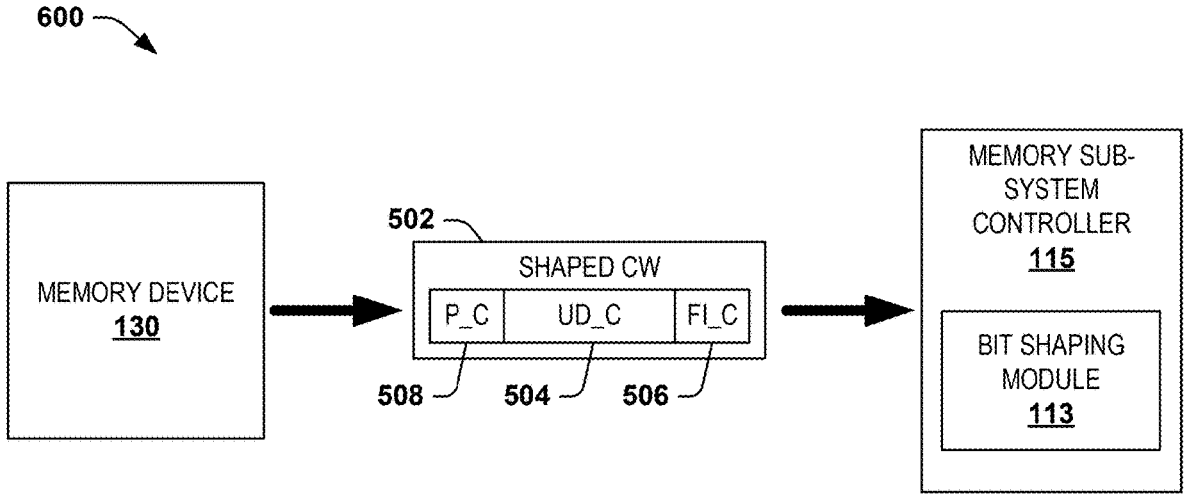
FIG. 6 illustrates an example diagram of a data read operation.

FIG. 6 illustrates an example diagram 600 of a data read operation. The data read operation can correspond to the shaped codeword 502 being subsequently read from the memory device 130. Storage of the shaped codeword 502 and access of the shaped codeword 502 from the memory device 130 can result in bit errors of the encoded shaped user data 504 within. Therefore, the shaped codeword 502 is thus provided to the memory sub-system controller 115 to imple-ment a decoding process that can correct the bit errors (such as via an LDPC decoding algorithm).

To decode the shaped codeword 502, the parity data 320 can be recovered from the shaped parity data 508 to properly decode the shaped codeword 502. The bit-shaping module 113 can thus implement a parity recovery algorithm to recover the parity data 320 from the shaped parity data 508. However, like the encoded shaped user data 504, the shaped parity data 508 can be subject to bit errors as well based on the storage and access of the shaped codeword 502 from the memory device 130. Accordingly, the bit-shaping module 113 can implement the parity recovery algorithm to recover the parity data 320 from the shaped parity data 508 in a manner that is agnostic of, and thus regardless of, the bit errors in the shaped parity data 508. As described below, the parity recovery process can be an iterative parity data recovery process that can evaluate the identity matrix of the shaped parity data 508 to un-flip the block columns that were flipped during the encoding process.

As an example, the iterative parity data recovery process can, at each iterative step i, can compare the syndrome weight of the block column/layer intersection at i, and thus the syndrome weight of the syndrome vector associated with the respective block column i, with a threshold. If the syndrome weight is greater than the threshold, then the iterative parity data recovery process can flip the bits of the entire block column i of the identity matrix $H_P$ of the shaped parity data 508. As a result, the flipping of the bits of the block column i can correspond to an un-flip of the bits of the block column i during the shaping of the parity data by the parity-shaping algorithm 322. However, flipping the bits of one block column can result in changes to the bits of another block column based on the connection of the check nodes in a layer across block columns.

As a result, the iterative parity data recovery process is iterative, and thus steps through multiple iterations of com-parisons and bit flips of the block columns of the identity matrix $H_P$. For example, the iterative parity data recovery process can step through i values from the first value of i (e.g., i=0) and the last value of i (e.g., i=99) in each iteration, and can begin another iteration to flip the bits of the block columns again based on the comparison with the threshold. The iterations can continue until no more bits of any of the block columns are flipped. In response to none of the bits of the block columns being flipped by the iterative parity data recovery process across a given iteration, the iterative parity data recovery process can conclude, thus providing the recovered parity data 320. The shaped encoded user data 504 can thus be decoded (e.g., by a QC-LDPC decoding process) based on the recovered parity data 320.

Figure 7:
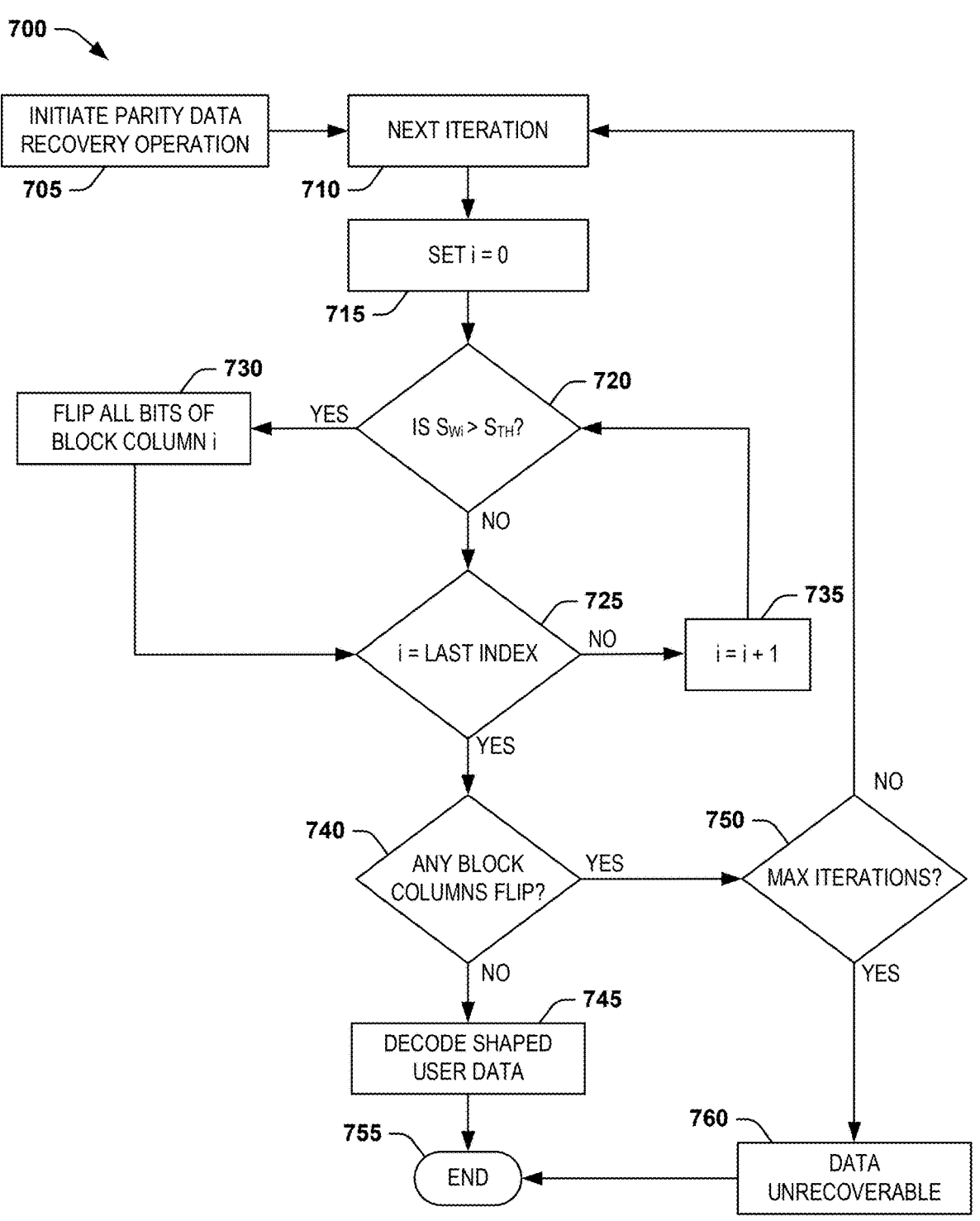
FIG. 7 illustrates an example flow diagram of a method for recovering parity data from a shaped codeword read from a memory device.

FIG. 7 illustrates a flow diagram of a method 700 for recovering parity data from a shaped codeword read from a memory device (e.g., the memory device 130). The method 700 can be implemented, for example, by a controller, such as the memory sub-system controller 115 (e.g., the bit-shaping module 113) of the system 100 of FIG. 1A. The method 700 can thus correspond to operation of the iterative parity data recovery process described herein. The method begins at 705, in which the controller initiates the iterative parity data recovery process. The method then proceeds to 710.

At 710, the bit-shaping module 113 initiates a next iteration of the iterative parity data recovery process. If the method 700 arrives at 710 from 705, then the next iteration is the first iteration of the iterative parity data recovery process. The method then proceeds to 715. At 715, the iterative parity data recovery process sets the index i to zero to begin the iteration. The index i=0 thus evaluates the first layer ("LAYER 0") and the first block column. The method then proceeds to 720.

At 720, a determination is made as to whether the syndrome weight $S_{Wi}$ of the respective block column i is greater than the threshold $S_{TH}$. In the example of FIG. 7, the threshold $S_{TH}$ can be a static threshold, and can be equal to half the circulant size of the identity matrix (e.g., $S_{TH}$=100). If the determination at 720 is negative (e.g., NO), and thus the syndrome weight $S_{Wi}$ of the respective block column i is less than the threshold $S_{TH}$, then the iterative parity data recovery process does not flip the bits of the block column i. The method 700 proceeds to 725. If the determination at 720 is positive (e.g., YES), and thus the syndrome weight $S_{Wi}$ of the respective block column i is greater than the threshold $S_{TH}$, then the method 700 proceeds to 730.

At 730, reached if the determination at 720 is positive, the iterative parity data recovery process flips all of the bits of the respective block column i. The method then proceeds to 725. At 725, the iterative parity data recovery process determines if the value of the index i is equal to the last index value of i (e.g., 99). If the determination at 725 is negative (e.g., NO), then the method proceeds to 735. If the determination at 725 is positive (e.g., YES), then the method proceeds to 740. At 735, the index i is incremented by one, and thus to the next consecutive value of the index i. Therefore, the method 700 returns to the determination at 720, at which the next block column/layer is evaluated. Thus, the syndrome weight $S_{Wi}$ of the next block column i is compared with the threshold $S_{TH}$ at 720 to flip or not flip the respective block column at each index step i until the i has a highest value (e.g., 99). Upon the index i having a highest value, the iteration concludes, and thus the determination at 725 is positive.

At 740, reached when the determination at 725 is positive, a determination is made as to whether the bits of any of the block columns flipped in the iteration. If the determination at 740 is negative (e.g., NO), then the method proceeds to 745. If the determination at 740 is positive (e.g., YES), then the method proceeds to 750. At 745, the parity data has been successfully recovered, and the shaped encoded user data (e.g., the shaped encoded user data 504) is decoded by the memory sub-system controller 115 (e.g., via the QC-LDPC decoder). The method 700 thus proceeds to 755 at which the method 700, and thus the iterative parity data recovery process, concludes.

At 750, reached if the determination at 740 is positive (e.g., YES), and thus if the bits of any of the block columns flipped during the iteration, a determination is made as to whether the quantity of iterations of the iterative parity data recovery process has reached a maximum quantity of iterations. If the determination at 750 is negative (e.g., NO), then the method returns to 710, at which the next iteration is selected for operation of the iterative parity data recovery process. If the determination at 750 is positive (e.g., YES), then the method proceeds to 760, at which there is an indication that the parity data is unrecoverable. Thus, the determination at 750 can act as a timeout check for operation of the bit-shaping module 113. The method then proceeds to 755 at which the method 700, and thus the iterative parity data recovery process, concludes.

The method 700 is one example of operation of the iterative parity data recovery process. In the method 700, the iterative parity data recovery process operates in a manner that is agnostic as to whether any of the bits of the block columns of the identity matrix $H_P$ had flipped to shape the parity data via the parity-shaping algorithm 322. However, as described above, as another example, the parity-shaping algorithm 322 can generate parity flip indicator data 510. The parity flip indicator data 510 can be implemented in another example operation of the iterative parity data recovery process, as demonstrated in the example of FIG. 8.

Figure 8:
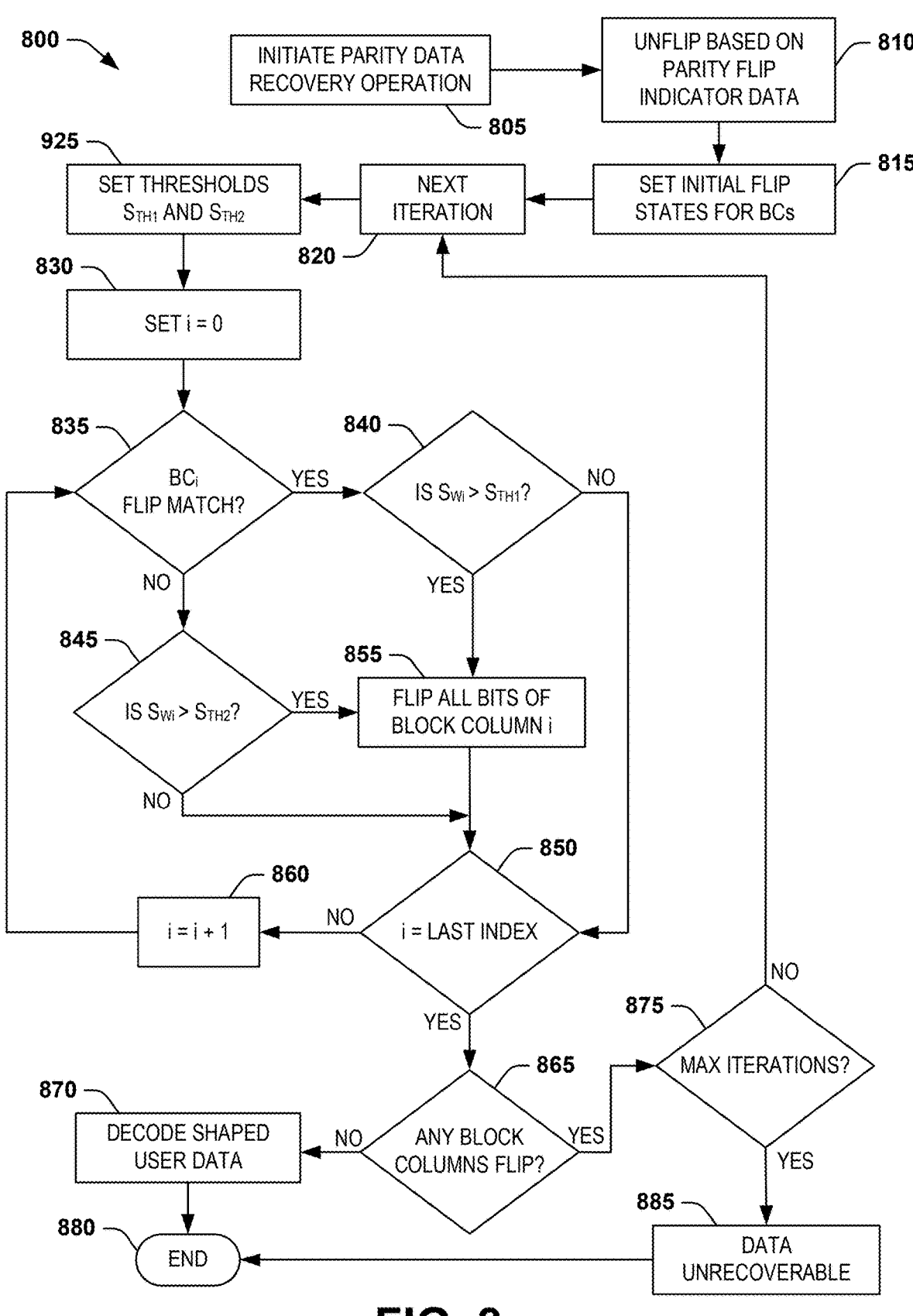
FIG. 8 illustrates another example flow diagram of a method for recovering parity data from a shaped codeword read from a memory device.
Figure 9:
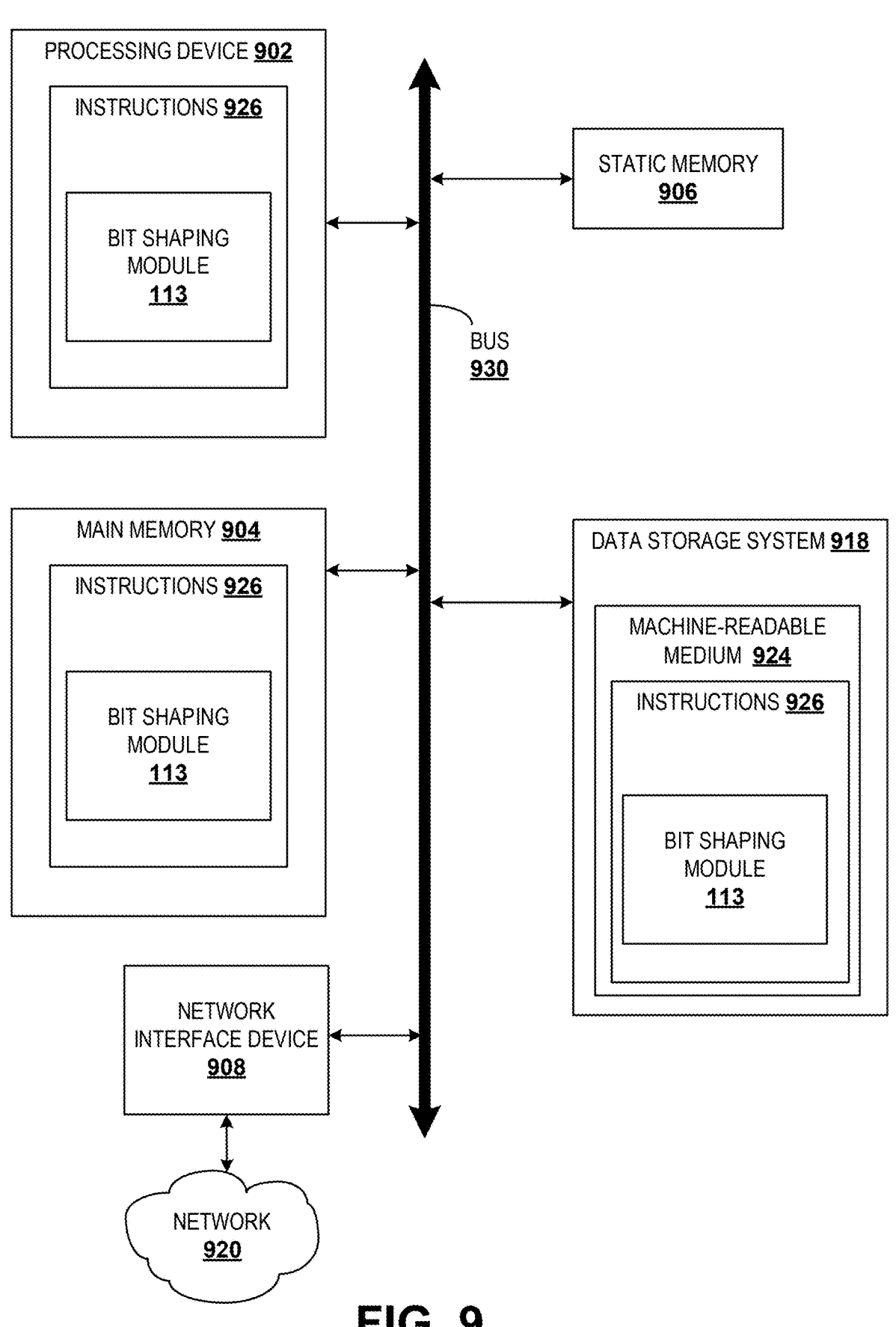
FIG. 9 illustrates an example of a computer system in which examples of the present description may operate.

FIG. 8 illustrates a flow diagram of a method 800 for recovering parity data from a shaped codeword read from a memory device (e.g., the memory device 130). The method 800 can be implemented, for example, by a controller, such as the memory sub-system controller 115 (e.g., the bit-shaping module 113) of the system 100 of FIG. 1A. The method 800 can thus correspond to operation of the iterative parity data recovery process described herein, in which the parity flip indicator data 510 is generated. The method begins at 805, in which the controller initiates the iterative parity data recovery process. The method then proceeds to 810.

At 810, the iterative parity data recovery process un-flips the bits of the block columns that were flipped in the parity-shaping algorithm 322 based on the parity flip indicator data 510. The parity flip indicator data 510 can also have experienced bit errors while stored in the memory device 130 or accessed from the memory device 130. However, the parity flip indicator data 510 can provide a starting point for parity data recovery. The method proceeds to 815, at which the iterative parity data recovery process sets initial flip states for each of the block columns. The initial flip states can correspond to a bit flip indicator for each of the block columns, and thus an indication of whether the respective block column was flipped during the parity-shaping algorithm and un-flipped by the iterative parity data recovery process at 810. The method then proceeds to 820.

At 820, the bit-shaping module 113 initiates a next iteration of the iterative parity data recovery process. If the method 800 arrives at 820 from 815, then the next iteration is the first iteration of the iterative parity data recovery process. The method then proceeds to 825. At 825, the bit-shaping module 113 sets values for two thresholds that collectively correspond to the variable threshold, and which can each vary during operation of the iterative parity data recovery process. The first threshold $S_{TH1}$ can have a first value that is based on the current flip state of a given block column matching the initial flip state set at 815, and the second threshold $S_{TH2}$ can have a second value that is based on the current flip state of a given block column not matching the initial flip state set at 815. As an example, at 825, the bit-shaping module 113 can change the values of the first and second thresholds based on a variety of other factors, such as the value of the index i and/or the current iteration count. For example, the first threshold $S_{TH1}$ can be initially set to a value equal to half the circulant size of the identity matrix (e.g., $S_{TH1}$=100). The method 800 then proceeds to 830.

At 830, the iterative parity data recovery process sets the index i to zero to begin the iteration. The index i=0 thus evaluates the first layer ("LAYER 0") and the first block column. The method then proceeds to 835. At 835, a determination is made as to whether the block column at index i has a current flip state that matches the initial flip state set at 815. In the first iteration, because of the un-flip operation provided by the bit-shaping module 113 at 810, each of the block columns will be determined to be a match. However, in subsequent iterations, one or more of the block columns may have flip states that no longer match the respective initial flip state of the respective block column. If the determination at 835 is positive (e.g., YES), and thus the current flip state of the block column matches the respective initial flip state of the block column, then the method 800 proceeds to 840. If the determination at 835 is negative (e.g., NO), and thus the current flip state of the block column does not match the respective initial flip state of the block column, then the method 800 proceeds to 845.

At 840, a determination is made as to whether the syndrome weight $S_{wi}$ of the respective block column i is greater than the first threshold $S_{TH1}$. If the determination at 840 is negative (e.g., NO), and thus the syndrome weight $S_{wi}$ of the respective block column i is less than the first threshold $S_{TH1}$, then the iterative parity data recovery process does not flip the bits of the block column i. The method 800 proceeds to 850. If the determination at 840 is positive (e.g., YES), and thus the syndrome weight $S_{wi}$ of the respective block column i is greater than the first threshold $S_{TH1}$, then the method 800 proceeds to 855.

At 845, reached if the determination at 835 is negative, and thus that the current flip state of the block column does not match the respective initial flip state of the block column, a determination is made as to whether the syndrome weight $S_{wi}$ of the respective block column i is greater than the second threshold $S_{TH2}$. If the determination at 845 is negative (e.g., NO), and thus the syndrome weight $S_{wi}$ of the respective block column i is less than the second threshold $S_{TH2}$, then the iterative parity data recovery process does not flip the bits of the block column i. The method 800 proceeds to 850. If the determination at 845 is positive (e.g., YES), and thus the syndrome weight $S_{wi}$ of the respective block column i is greater than the second threshold $S_{TH2}$, then the method 800 proceeds to 855.

At 855, reached if the determination at either 840 or 845 is positive, the iterative parity data recovery process flips all of the bits of the respective block column i. The method then proceeds to 850. At 850, the iterative parity data recovery process determines if the value of the index i is equal to the last index value of i (e.g., 99). If the determination at 850 is negative (e.g., NO), then the method proceeds to 860. If the determination at 850 is positive (e.g., YES), then the method proceeds to 865. At 860, the index i is incremented by one, and thus to the next consecutive value of the index i. Therefore, the method 800 returns to the determination at 840, at which the next block column/layer is evaluated. Thus, the flip state of the next block column i is compared with the initial flip state set at 815. The subsequent block columns i in the iteration are thus compared with either the first threshold $S_{TH1}$ at 840 or the second threshold $S_{TH2}$ to flip or not flip the respective block column at each index step i until the i has a highest value (e.g., 99). Upon the index i having a highest value, the iteration concludes, and thus the determination at 850 is positive.

At 865, reached when the determination at 850 is positive, a determination is made as to whether the bits of any of the block columns flipped in the iteration. If the determination at 865 is negative (e.g., NO), then the method proceeds to 870. If the determination at 865 is positive (e.g., YES), then the method proceeds to 875. At 870, the parity data has been successfully recovered, and the shaped encoded user data (e.g., the shaped encoded user data 504) is decoded by the memory sub-system controller 115 (e.g., via the QC-LDPC decoder). The method 800 thus proceeds to 880 at which the method 800, and thus the iterative parity data recovery process, concludes.

At 875, reached if the determination at 865 is positive (e.g., YES), and thus if the bits of any of the block columns flipped during the iteration, a determination is made as to whether the quantity of iterations of the iterative parity data recovery process has reached a maximum quantity of iterations. If the determination at 875 is negative (e.g., NO), then the method returns to 820, at which the next iteration is selected for operation of the iterative parity data recovery process. If the determination at 875 is positive (e.g., YES), then the method proceeds to 885, at which there is an indication that the parity data is unrecoverable. Thus, the determination at 875 can act as a timeout check for operation of the bit-shaping module 113. Alternatively to indicating unrecoverable parity data, the controller can instead attempt to decode the codeword before determining that the parity data and/or the encoded user data is unrecoverable. The method then proceeds to 880 at which the method 800, and thus the iterative parity data recovery process, concludes.

The examples of FIGS. 7 and 8 thus demonstrate two different examples of operation of the iterative parity data recovery process. In either example, the parity data 320 is recovered from the shaped parity data 508 after the shaped codeword 502 is read from the memory device 130. The shaped user data can thus be decoded using any of a variety of decoding techniques (e.g., QC-LDPC).

FIG. 10 illustrates an example machine of a computer system 1000 (a machine) within which a set of instructions, for causing the machine to perform any one or more of the methodologies discussed herein, can be executed. In some examples, the computer system 1000 corresponds to a host system (e.g., the host system 120 of FIG. 1A) that includes, is coupled to, or utilizes a memory sub-system (e.g., the memory sub-system 110 of FIG. 1A) or is used to perform the operations of a controller (e.g., to execute an operating system to perform operations corresponding to the bit-shaping module 113 of FIG. 1A). In other examples, the machine is connected (e.g., networked) to other machines in a LAN, an intranet, an extranet and/or the Internet. In various examples, the machine operates in the capacity of a server or a client machine in client-server network environment, as a peer machine in a peer-to-peer (or distributed)

network environment or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge or any machine capable of executing a set of instructions (sequential or otherwise) that specify actions to be taken by that machine. In other examples, the machine may be a computer within an automotive application, a data center, a smart factory, or other industrial application. Further, while a single machine is illustrated, the term "machine" shall also be taken to include any collection of machines that individually or jointly execute a set (or multiple sets) of instructions to perform the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM) or other non-transitory computer-readable media) and a data storage system 1018, which communicate with each other via a bus 1030.

The processing device 1002 represents one or more general-purpose processing devices such as a microprocessor, a central processing unit, etc. More particularly, the processing device 1002 can be a complex instruction set computing (CISC) microprocessor, reduced instruction set computing (RISC) microprocessor, very long instruction word (VLIW) microprocessor or a processor implementing other instruction sets or processors implementing a combination of instruction sets. In some examples, the processing device 1002 is implemented with a special-purpose processing devices such as an application specific integrated circuit (ASIC), a field programmable gate array (FPGA), a digital signal processor (DSP), network processor, etc. The processing device 1002 is configured to execute instructions 1026 for performing the operations discussed herein. In some examples, the computer system 1000 includes a network interface device 1008 to communicate over the network 1020.

The data storage system 1018 includes a machine-readable storage medium 1024 (also known as a computer-readable medium) that store sets of instructions 1026 or software for executing the methodologies and/or functions described herein. The machine-readable storage medium 1024 is a non-transitory medium. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018 and/or main memory 1004 can correspond to the memory sub-system 110 of FIG. 1A. Accordingly, the machine-readable storage medium 1024, the data storage system 1018 and/or the main memory 1004 are examples of non-transitory computer-readable media.

In some examples, the instructions 1026 include instructions to implement functionality corresponding to the bit-shaping module 113 of FIG. 1A. As an example, the instructions can include implementing a parity-shaping algorithm 322 to shape parity data 320 after encoding shaped user data 306, and implementing an iterative parity data recovery process after the shaped codeword 502 is read from the memory device 130 to recover the parity data 320 from the shaped parity data 508. While the machine-readable storage medium 1024 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared and otherwise manipulated. It has proven convenient at times, principally for reasons of common usage, to refer to these signals as bits, values, elements, symbols, characters, terms, numbers, etc.

It is noted, however, that all of these and similar terms are to be associated with the appropriate physical quantities and are merely convenient labels applied to these quantities. This description can refer to the action and processes of a computer system or similar electronic computing device that manipulates and transforms data represented as physical (electronic) quantities within the computer system's registers and memories into other data similarly represented as physical quantities within the computer system memories or registers or other such information storage systems.

This description also relates to an apparatus for performing the operations herein. This apparatus can be specially constructed for the intended purposes or this apparatus can include a general purpose computer selectively activated or reconfigured by a computer program stored in the computer. Such a computer program can be stored in a computer readable storage medium, such as, but not limited to, any type of disk including floppy disks, optical disks, CD-ROMs, magnetic-optical disks, read-only memories (ROMs), random access memories (RAMs), EPROMS, EEPROMs, magnetic or optical cards or any type of media suitable for storing electronic instructions, each coupled to a computer system bus.

The algorithms and displays presented herein are not inherently related to any particular computer or other apparatus. Various general purpose systems can be used with programs in accordance with the descriptions herein, or it can prove convenient to construct a more specialized apparatus to perform the method. In addition, the present disclosure is not described with reference to any particular programming language. It will be appreciated that a variety of programming languages can be used to implement the teachings of the disclosure as described herein.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means "based at least in part on". Additionally, where the disclosure or claims recite "a," "an," "a first" or "another" element, or the equivalent thereof, it should be interpreted to include one or more than one such element, neither requiring nor excluding two or more such elements.

What is claimed is:

1. A method for decoding a shaped codeword comprising shaped parity bits, the method comprising:
   reading the shaped codeword from a memory device via a controller, the shaped codeword comprising shaped data and the shaped parity bits, the shaped codeword having been encoded via an identity matrix comprising an array of layers and block columns of parity data;
   recovering parity data from the shaped parity data of the shaped codeword via the controller, recovering the parity data comprising:
      comparing a syndrome weight of each of a plurality of block columns of the shaped parity data with a threshold; and
      flipping bits of each of the block columns of the shaped parity data in response to the syndrome weight of the respective one of the block columns being greater than the threshold to recover parity data from the shaped parity data of the shaped codeword; and
   decoding the shaped data based on the recovered parity data via the controller.

2. The method of claim 1, wherein recovering the parity data further comprises iteratively repeating the comparing of the syndrome weight with the threshold and the flipping of the bits of the respective block columns of the shaped parity data in an iterative parity data recovery process until the bits of none of the block columns of the shaped parity data are flipped in a given iteration of the iterative parity data recovery process.

3. The method of claim 2, wherein the threshold is a variable threshold having a value that varies at each iteration of the iterative parity data recovery process.

4. The method of claim 2, wherein reading the shaped codeword from the memory device comprises extracting parity flip indicator data from the shaped codeword, the parity flip indicator identifying the block columns of the parity data having flipped bits, wherein recovering the parity data comprises recovering the parity data based on the parity flip indicator data.

5. The method of claim 4, wherein recovering the parity data comprises un-flipping each of the block columns of the shaped parity data having flipped bits based on the parity flip indicator data to set an initial flip state associated with each of the block columns of the shaped parity data, wherein the threshold is a variable threshold having a value that varies based on a flip state of each of the block columns of the shaped parity data relative to the initial flip state of the respective one of the block columns of the shaped parity data.

6. The method of claim 5, wherein the value of the variable threshold further varies at each iteration of the iterative parity data recovery process.

7. The method of claim 5, wherein the value of the variable threshold varies based on whether the flip state of each of the block columns of the shaped parity data matches the initial flip state of the respective one of the block columns of the shaped parity data in a previous iteration of the iterative parity data recovery process.

8. The method of claim 1, wherein decoding the shaped data comprises decoding the shaped data via a QC-low density parity check (LDPC) decoding process.

9. A system decoding a shaped codeword comprising shaped parity bits, comprising:
   the memory device; and
   a processing device coupled to the memory device, the processing device to perform operations comprising:
      reading the shaped codeword from a memory device, the shaped codeword comprising shaped data and the shaped parity bits, the shaped codeword having been encoded via an identity matrix comprising an array of layers and block columns of parity data;
      recovering parity data from the shaped parity data of the shaped codeword, recovering the parity data comprising:
         comparing a syndrome weight of each of a plurality of block columns of the shaped parity data with a threshold; and
         flipping bits of each of the block columns of the shaped parity data in response to the syndrome weight of the respective one of the block columns being greater than the threshold to recover parity data from the shaped parity data of the shaped codeword; and
      decoding the shaped data based on the recovered parity data.

10. The system of claim 9, wherein recovering the parity data further comprises iteratively repeating the comparing of the syndrome weight with the threshold and the flipping of the bits of the respective block columns of the shaped parity data in an iterative parity data recovery process until the bits of none of the block columns of the shaped parity data are flipped in a given iteration of the iterative parity data recovery process.

11. The system of claim 10, wherein reading the shaped codeword from the memory device comprises extracting parity flip indicator data from the shaped codeword, the parity flip indicator identifying the block columns of the parity data having flipped bits, wherein recovering the parity data comprises recovering the parity data based on the parity flip indicator data.

12. The system of claim 11, wherein recovering the parity data comprises un-flipping each of the block columns of the shaped parity data having flipped bits based on the parity flip indicator data to set an initial flip state associated with each of the block columns of the shaped parity data, wherein the threshold is a variable threshold having a value that varies based on a flip state of each of the block columns of the shaped parity data relative to the initial flip state of the respective one of the block columns of the shaped parity data.

13. The system of claim 12, wherein the value of the variable threshold further varies at each iteration of the iterative parity data recovery process.

14. The system of claim 12, wherein the value of the variable threshold varies based on whether the flip state of each of the block columns of the shaped parity data matches the initial flip state of the respective one of the block columns of the shaped parity data in a previous iteration of the iterative parity data recovery process.

15. A non-transitory computer-readable storage medium comprising instructions that, when executed by a processing device, cause the processing device to decode a shaped codeword comprising shaped parity bits, the instructions comprising:

reading the shaped codeword from a memory device, the shaped codeword comprising shaped data and the shaped parity bits, the shaped codeword having been encoded via an identity matrix comprising an array of layers and block columns of parity data;

recovering parity data from the shaped parity data of the shaped codeword, recovering the parity data comprising:

comparing a syndrome weight of each of a plurality of block columns of the shaped parity data with a threshold; and flipping bits of each of the block columns of the shaped parity data in response to the syndrome weight of the respective one of the block columns being greater than the threshold to recover parity data from the shaped parity data of the shaped codeword; and decoding the shaped data based on the recovered parity data.

16. The medium of claim 15, wherein recovering the parity data further comprises iteratively repeating the comparing of the syndrome weight with the threshold and the flipping of the bits of the respective block columns of the shaped parity data in an iterative parity data recovery process until the bits of none of the block columns of the shaped parity data are flipped in a given iteration of the iterative parity data recovery process.

17. The medium of claim 16, wherein reading the shaped codeword from the memory device comprises extracting parity flip indicator data from the shaped codeword, the parity flip indicator identifying the block columns of the parity data having flipped bits, wherein recovering the parity data comprises recovering the parity data based on the parity flip indicator data.

18. The medium of claim 17, wherein recovering the parity data comprises un-flipping each of the block columns of the shaped parity data having flipped bits based on the parity flip indicator data to set an initial flip state associated with each of the block columns of the shaped parity data, wherein the threshold is a variable threshold having a value that varies based on a flip state of each of the block columns of the shaped parity data relative to the initial flip state of the respective one of the block columns of the shaped parity data.

19. The medium of claim 18, wherein the value of the variable threshold further varies at each iteration of the iterative parity data recovery process.

20. The medium of claim 18, wherein the value of the variable threshold varies based on whether the flip state of each of the block columns of the shaped parity data matches the initial flip state of the respective one of the block columns of the shaped parity data in a previous iteration of the iterative parity data recovery process.

* * * * *